(12) United States Patent
Jeong et al.

(10) Patent No.: US 8,188,803 B2
(45) Date of Patent: May 29, 2012

(54) APPARATUS AND METHOD FOR DIGITAL UP CONVERTING IN A MOBILE COMMUNICATION SYSTEM

(75) Inventors: Seung-Il Jeong, Yongin-si (KR); Byung-Ki Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 322 days.

(21) Appl. No.: 12/607,426

(22) Filed: Oct. 28, 2009

(65) Prior Publication Data

US 2010/0104055 A1    Apr. 29, 2010

(30) Foreign Application Priority Data

Oct. 28, 2008  (KR) .................. 10-2008-0105624

(51) Int. Cl.
*H04B 1/66*  (2006.01)

(52) U.S. Cl. ......... 332/101; 332/102; 375/240; 375/303
(58) Field of Classification Search .................. 332/101, 332/102; 375/240, 303
See application file for complete search history.

(56) References Cited

U.S. PATENT DOCUMENTS

| 7,561,076 B2 * | 7/2009 | Zoso et al. .................. 341/61 |
| 2007/0288977 A1 * | 12/2007 | Shalvi et al. .................. 725/111 |

* cited by examiner

*Primary Examiner* — James E Goodley
(74) *Attorney, Agent, or Firm* — Jefferson IP Law, LLP

(57) ABSTRACT

An apparatus and method for digital up converting in a mobile communication system are provided. The apparatus includes a Selectable Input Logic (SIL), a Scalable Clock Distribution Logic (SCDL), a filter logic, and a mixer logic. The SIL performs decimation at a decimation rate. The SCDL controls a clock frequency. The filter logic performs channel filtering for the decimated signal, and performs interpolation at an interpolation rate variable. The mixer logic up-converts the signal provided from the filter logic.

16 Claims, 6 Drawing Sheets

APPARATUS AND METHOD FOR DIGITAL UP CONVERTING IN A MOBILE COMMUNICATION SYSTEM

PRIORITY

This application claims the benefit under 35 U.S.C. §119(a) of a Korean patent application filed in the Korean Intellectual Property Office on Oct. 28, 2008 and assigned Ser. No. 10-2008-0105624, the entire disclosure of which is hereby incorporated by reference.

BACKGROUND OF THE INVENTION

1. Field of the Invention

The present invention relates to an apparatus and method for digital up converting in a mobile communication system. More particularly, the present invention relates to a digital up converting apparatus for supporting a variety of frequency bands with minimum hardware and an operation method thereof.

2. Description of the Related Art

In general, a digital up converter included in a digital transceiver board of a mobile communication system performs functions of interpolation, filtering, and frequency shifting using a digital signal processing technology. In more detail, the digital up converter frequency-shifts a baseband signal input from a channel card and up-converts the frequency-shifted baseband signal into an intermediate frequency signal. At this time, the digital up converter performs interpolation and increases a data rate of the signal, and performs digital filtering and removes a noise besides a signal band used for communication.

On the other hand, the standard of a Long Term Evolution (LTE) system provides five frequency bandwidths, i.e., frequency bandwidths of 1.4 MHz, 3 MHz, 5 MHz, 10 MHz, and 20 MHz. However, the conventional art does not provide a technique for supporting all of the five frequency bandwidths in a single hardware structure. Undoubtedly, the conventional art may process several kinds of bandwidth signals through a single hardware structure. However, in this case, there is a problem that, as a pass bandwidth decreases compared to a sampling frequency, a tap count of a Channel Shaping Filter (CSF) suddenly increases.

Table 1 below illustrates a filter tap count necessary to support the five bandwidth signals defined in the LTE standard in a digital up converter according to the conventional art.

TABLE 1

| Bandwidth | Filter tap count |
|---|---|
| 20 MHz | 51 Taps |
| 10 MHz | 101 Taps |
| 5 MHz | 201 Taps |
| 3 MHz | 401 Taps |
| 1.4 MHz | 601 Taps |

As illustrated in Table 1, as a pass bandwidth decreases compared to a sampling frequency, the digital up converter according to the conventional art requires a great number of filter taps count. To support all of the five bandwidth signals, as illustrated in FIG. 1, the digital up converter should have 601 taps 100 required by 1.4 MHz that is the lowest bandwidth among the five bandwidths. That is, to process a 1.4 MHz bandwidth signal using a sampling frequency of 30.72 MHz, the digital up converter requires multipliers of the number corresponding to 601 as taps of a channel shaping filter. Accordingly, there is a problem that a hardware realization complexity increases. More particularly, the multiplier is one of Arithmetic Logic Units (ALUs) having high realization complexities in a digital hardware.

Accordingly, there is a problem that, from the hardware complexity side, it is inefficient to support a variety of frequency bandwidths by the conventional digital up converter.

SUMMARY OF THE INVENTION

An aspect of the present invention is to address at least the above-mentioned problems and/or disadvantages and to provide at least the advantages described below. Accordingly, one aspect of the present invention is to provide an apparatus and method for digital up converting in a mobile communication system.

Another aspect of the present invention is to provide an apparatus and method for digital up converting to support a variety of frequency bandwidths using the minimum hardware resources in a mobile communication system.

A further aspect of the present invention is to provide an apparatus and method for digital up converting to control a sample rate variably depending on a frequency bandwidth of an input signal in a mobile communication system.

Yet another aspect of the present invention is to provide an apparatus and method for digital up converting to control clock frequencies provided to a plurality of filters depending on a frequency bandwidth of an input signal in a mobile communication system.

In accordance with an aspect of the present invention, a digital up converting apparatus in a mobile communication system is provided. The apparatus includes a Selectable Input Logic (SIL) for receiving an input of a signal from a channel card and for performing decimation at a decimation rate variable depending on a frequency bandwidth of the input signal, a Scalable Clock Distribution Logic (SCDL) for controlling a clock frequency depending on the frequency bandwidth of the input signal, a filter logic for receiving a clock from the SCDL, for performing channel filtering for the decimated signal according to standards regulated depending on the frequency bandwidth of the input signal and for performing interpolation at an interpolation rate variable depending on the frequency bandwidth of the input signal, and a mixer logic for up-converting the signal provided from the filter logic.

In accordance with another aspect of the present invention, an operation method of a digital up converter in a mobile communication system is provided. The method includes performing decimation at a decimation rate variable depending on a frequency bandwidth of a signal input from a channel card, controlling a clock frequency depending on the frequency bandwidth of the input signal, receiving a clock and performing channel filtering for the decimated signal according to standards regulated depending on the frequency bandwidth of the input signal, performing interpolation for the channel-filtered signal at an interpolation rate variable depending on the frequency bandwidth of the input signal, and up-converting the interpolated signal.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will become more apparent from the following description taken in conjunction with the accompanying drawings, in which.

Throughout the drawings, it should be noted that like reference numbers are used to depict the same or similar elements, features and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

A digital up converting apparatus for supporting a variety of frequency bandwidths using the minimum hardware resources in a mobile communication system according to an exemplary embodiment of the present invention and an operation method thereof are described below. The following description is, for example, made for a case of inputting five frequency bandwidths defined in the Long Term Evolution (LTE) standard, i.e., frequency bandwidths of 1.4 MHz, 3 MHz, 5 MHz, 10 MHz, and 20 MHz, but the present invention is applicable even to a case of inputting a different frequency bandwidth. Also, in the following description, a data clock rate is constant as 30.72 MHz irrespective of a frequency bandwidth. This is because there is an advantage of being capable of making a size of Fast Fourier Transform (FFT) used in a modem constant and making an interface between a channel card and a digital transceiver board substantially identical irrespective of a signal bandwidth.

Figure 1:
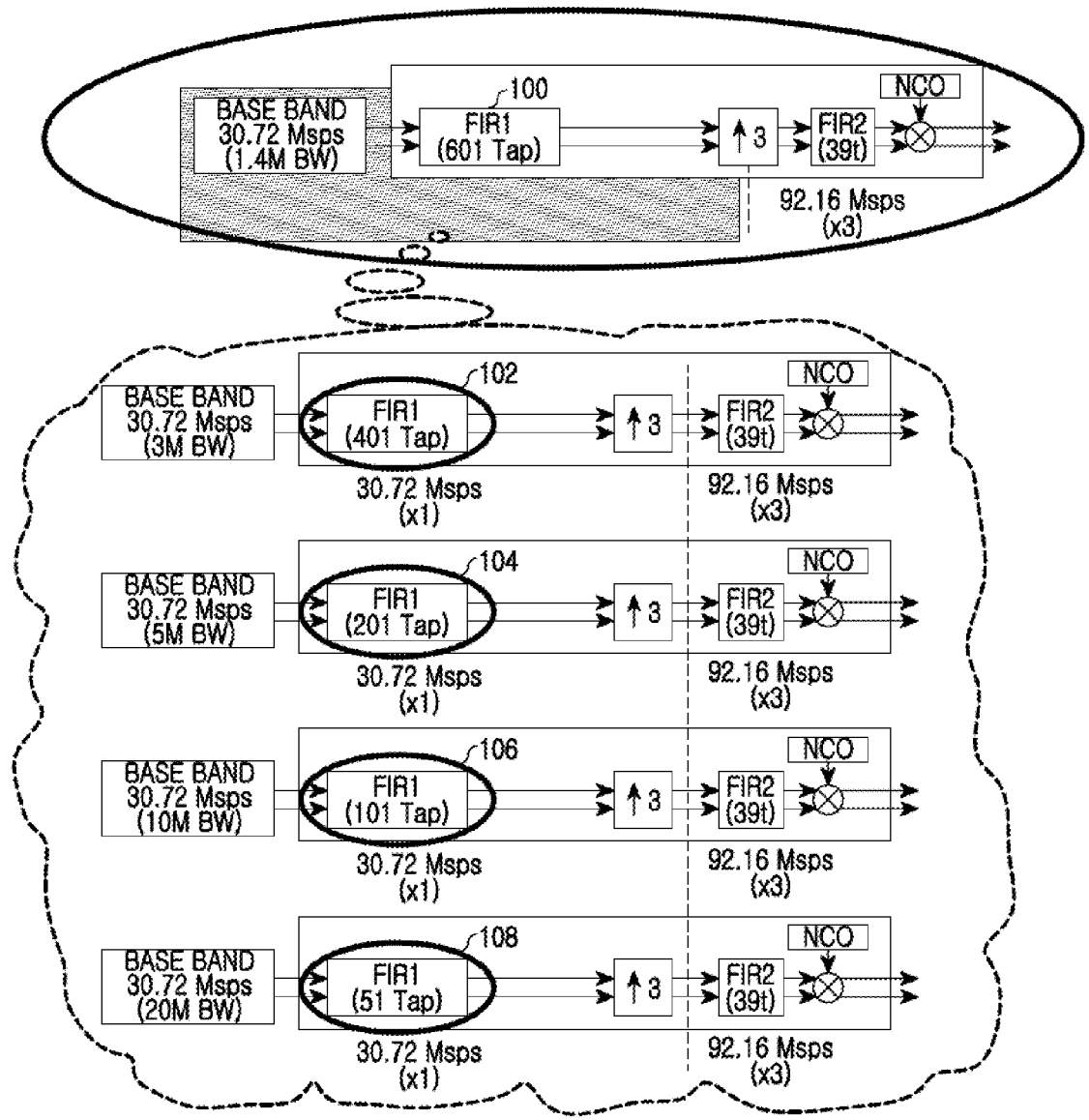
FIG. 1 is a diagram illustrating a construction of a digital up converter in a mobile communication system according to the conventional art.
Figure 2:
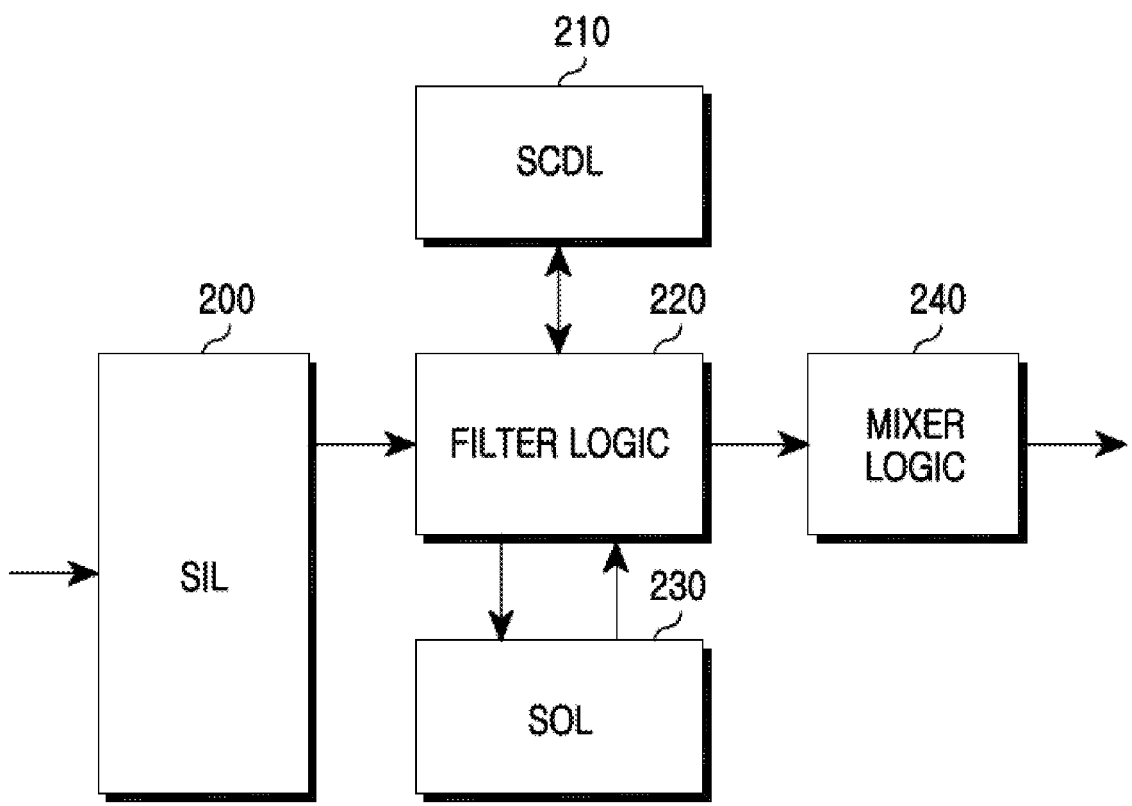
FIG. 2 is a block diagram illustrating a schematic construction of a digital up converter in a mobile communication system according to an exemplary embodiment of the present invention.

FIG. 2 is a block diagram illustrating a schematic construction of a digital up converter in a mobile communication system according to an exemplary embodiment of the present invention.

Referring to FIG. 2, the digital up converter according to an exemplary embodiment of the present invention includes a Selectable Input Logic (SIL) 200, a Scalable Clock Distribution Logic (SCDL) 210, a filter logic 220, a Selectable Output Logic (SOL) 230, and a mixer logic 240.

The SIL 200 receives an input of a baseband signal from a channel card, performs decimation depending on a frequency bandwidth of the input baseband signal, and controls a signal sample rate. At this time, a decimation rate of the SIL 200 is variable depending on the bandwidth of the input signal.

Depending on the frequency bandwidth of the baseband signal input to the SIL 200, the SCDL 210 controls a clock frequency provided to each filter included in the filter logic 220.

The filter logic 220 receives a clock from the SCDL 210 and performs a function of interpolation and filtering. At this time, the filter logic 220 performs channel filtering according to standards regulated depending on the frequency bandwidth of the input signal. After that, the filter logic 220 performs as much interpolation as the SIL 200 performs decimation, and controls a sample rate. That is, an interpolation rate of the filter logic 220 is variable depending on the bandwidth of the input signal.

The SOL 230 receives a signal interpolated in the filter logic 220 depending on the bandwidth of the input signal, and outputs the signal.

The mixer logic 240 includes a Numerically Controlled Oscillator (NCO) and a mixer, and shifts a frequency of the signal output from the SOL 230.

Then, the signal frequency-shifted by the mixer logic 240 is converted into an analog signal through a Digital to Analog Converter (DAC) (not shown), goes through signal processing, and is transmitted through an antenna.

A detailed construction of the digital up converter is described below on the basis of the construction of FIG. 2.

Figure 3:
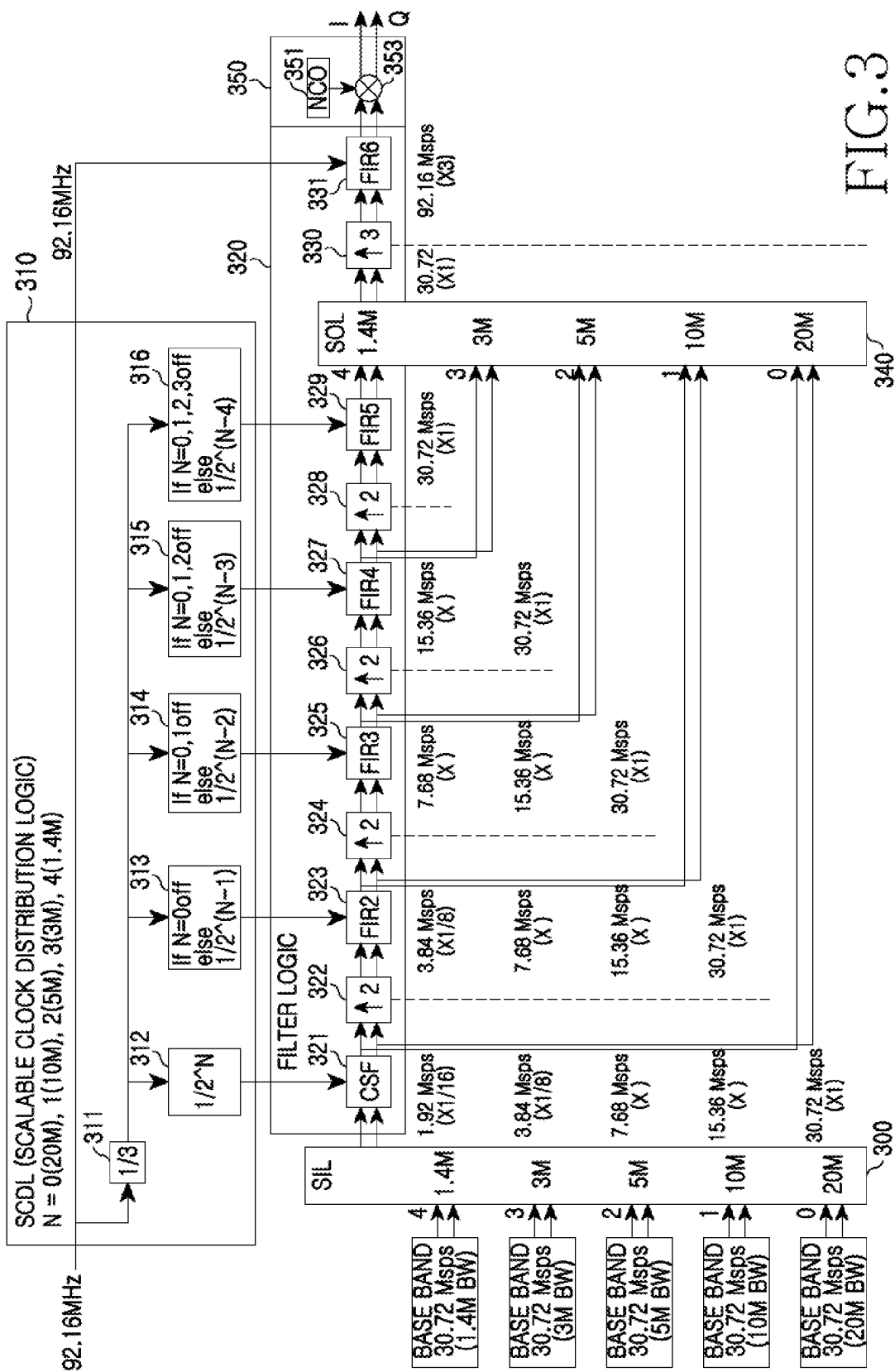
FIG. 3 is a diagram illustrating a detailed construction of a digital up converter in a mobile communication system according to an exemplary embodiment of the present invention.

FIG. 3 is a diagram illustrating a detailed construction of a digital up converter in a mobile communication system according to an exemplary embodiment of the present invention.

Figure 4:
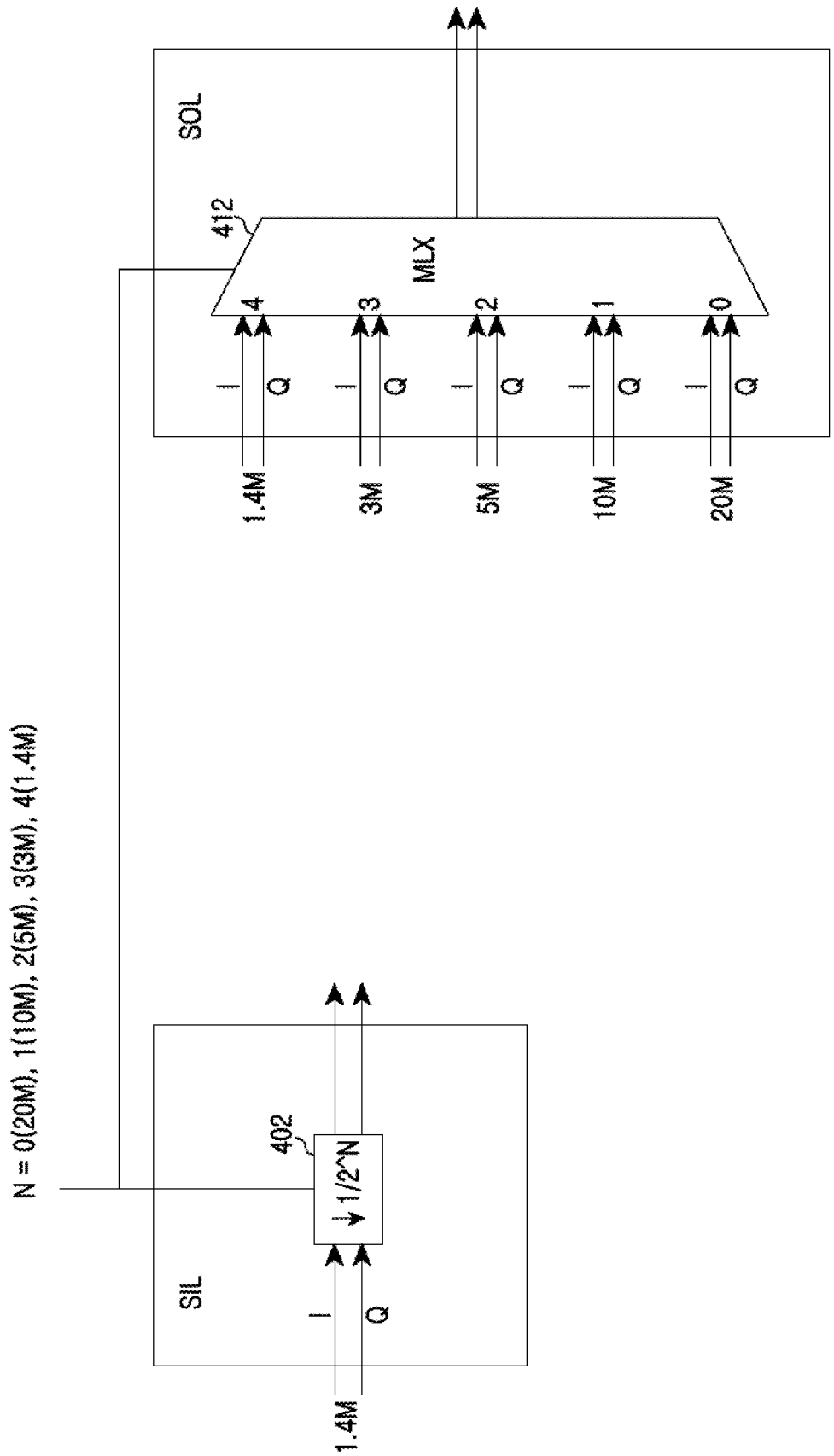
FIG. 4 is a diagram illustrating a detailed construction of a Selectable Input Logic (SIL) and a Selectable Output Logic (SOL) in a mobile communication system according to an exemplary embodiment of the present invention.

FIG. 4 is a diagram illustrating a detailed construction of a Selectable Input Logic (SIL) and a Selectable Output Logic (SOL) in a mobile communication system according to an exemplary embodiment of the present invention.

Referring to FIG. 3 and FIG. 4, the SIL 300 includes a decimator 402 of FIG. 4 for controlling a sample rate by $1/(2^N)$. Thus, the SIL 300 performs decimation depending on a frequency bandwidth of an input baseband signal and controls a signal sample rate. Here, the 'N' is a value representing the frequency bandwidth of the input signal. In detail, if the frequency bandwidth of the input signal is equal to 20 MHz, the 'N' is equal to 0. If the frequency bandwidth of the input signal is equal to 10 MHz, the 'N' is equal to 1. If the frequency bandwidth of the input signal is equal to 5 MHz, the 'N' is equal to 2. If the frequency bandwidth of the input signal is equal to 3 MHz, the 'N' is equal to 3. If the frequency bandwidth of the input signal is equal to 1.4 MHz, the 'N' is equal to 4. Here, the 'N' may be set by a user. That is, if the bandwidth of the input signal is equal to 20 MHz, the SIL 300 performs no decimation. If the bandwidth of the input signal is equal to 10 MHz, the SIL 300 performs decimation at a decimation rate of 2. If the bandwidth of the input signal is equal to 5 MHz, the SIL 300 performs decimation at a decimation rate of 4. If the bandwidth of the input signal is equal to 3 MHz, the SIL 300 performs decimation at a decimation rate of 8. If the bandwidth of the input signal is equal to 1.4 MHz, the SIL 300 performs decimation at a decimation rate of 16.

Depending on a bandwidth of an input signal, the SCDL 310 variably controls clocks provided to multi-stage interpolation filters 323, 325, 327, and 329 included in the filter logic 320. For the sake of this, the SCDL 310 includes first to sixth splitters 311 to 316. The first splitter 311 splits a reference clock of 92.16 MHz by ⅓, and generates a clock of 30.72 MHz. In consideration of the bandwidth of the input signal, the second to sixth splitters 312 to 316 split the generated clock of 30.72 MHz by $1/(2^N)$, $1/(2^{N-1})$, $1/(2^{N-2})$, $1/(2^{N-3})$, and $1/(2^{N-4})$ or turn off.

Operations of the first to sixth splitters 311 to 316 are described below in detail. The first splitter 311 splits the reference clock of 92.16 MHz by ⅓ and provides the clock of 30.72 MHz to the second to sixth splitters 312 to 316. And, the second splitter 312 splits, by $1/(2^N)$, the clock of 30.72 MHz input from the first splitter 311 and provides the split clock to a Channel Shaping Filter (CSF) 321 of the filter logic 320.

Also, if the input 'N' is equal to 0, the third splitter 313 turns off and, otherwise, splits, by $1/(2^{N-1})$, the clock of 30.72 MHz input from the first splitter 311 and provides the split clock to a Finite Impulse Response 2 (FIR2) filter 323 of the filter logic 320. Also, if the 'N' is equal to 0 or 1, the fourth splitter 314 turns off and, otherwise, splits, by $1/(2^{N-2})$, the clock of 30.72 MHz input from the first splitter 311 and provides the split clock to an FIR3 filter 325 of the filter logic 320. Also, if the 'N' is equal to 0, 1, or 2, the fifth splitter 315 turns off and, otherwise, splits, by $1/(2^{N-3})$, the clock of 30.72 MHz input from the first splitter 311 and provides the split clock to an FIR4 filter 327 of the filter logic 320. If the 'N' is equal to 0, 1, 2, or 3, the sixth splitter 316 turns off and, otherwise, splits, by $1/(2^{N-4})$, the clock of 30.72 MHz input from the first splitter 311 and provides the split clock to an FIR5 filter 329 of the filter logic 320.

That is, the SCDL 310 operates to distribute clocks of Table 2 below to the filter logic 320 depending on a bandwidth of an input signal.

TABLE 2

| Bandwidth of input signal (MHz) | Clock of CSF (321) (MHz) | Clock of FIR2 (323) (MHz) | Clock of FIR3 (325) (MHz) | Clock of FIR4 (327) (MHz) | Clock of FIR5 (329) (MHz) |
|---|---|---|---|---|---|
| 20 | 30.72 | Off | Off | Off | Off |
| 10 | 15.36 | 30.72 | Off | Off | Off |
| 5 | 7.68 | 15.36 | 30.72 | Off | Off |
| 3 | 3.84 | 7.68 | 15.36 | 30.72 | Off |
| 1.4 | 1.92 | 3.84 | 7.68 | 15.36 | 30.72 |

As illustrated in Table 2, if the input signal bandwidth is equal to 20 MHz, the input 'N' is equal to 0. Thus, only the first and second splitters 311 and 312 operate and the third to sixth splitters 313 to 316 turn off, thus providing the clock of 30.72 MHz only to the CSF 321 and providing no clock to other FIR2 to FIR5 filters 323, 325, 327, and 329. Also, if the input signal bandwidth is equal to 1.4 MHz, the input 'N' is equal to 4. Thus, the first to sixth splitters 311 to 316 all operate, thus providing the clocks of 1.92 MHz, 3.84 MHz, 7.68 MHz, 15.36 MHz, and 30.72 MHz to the CSF 321 and the FIR2 to FIR5 filters 323, 325, 327, and 329, respectively.

Here, a filter processing at a low frequency may be a poly-phase filter increasing a clock rate compared to a data rate by a multiple and processing.

The filter logic 320 includes a single CSF 321, four interpolators 322, 324, 326, and 328 of an interpolation rate of 2, and four FIR2 to FIR5 filters 323, 325, 327, and 329. Thus, the filter logic 320 receives clocks from the SCDL 310, performs channel filtering according to standards regulated depending on a frequency bandwidth of an input signal, performs as much interpolation as the SIL 300 performs decimation, and performs filtering.

Figure 5:
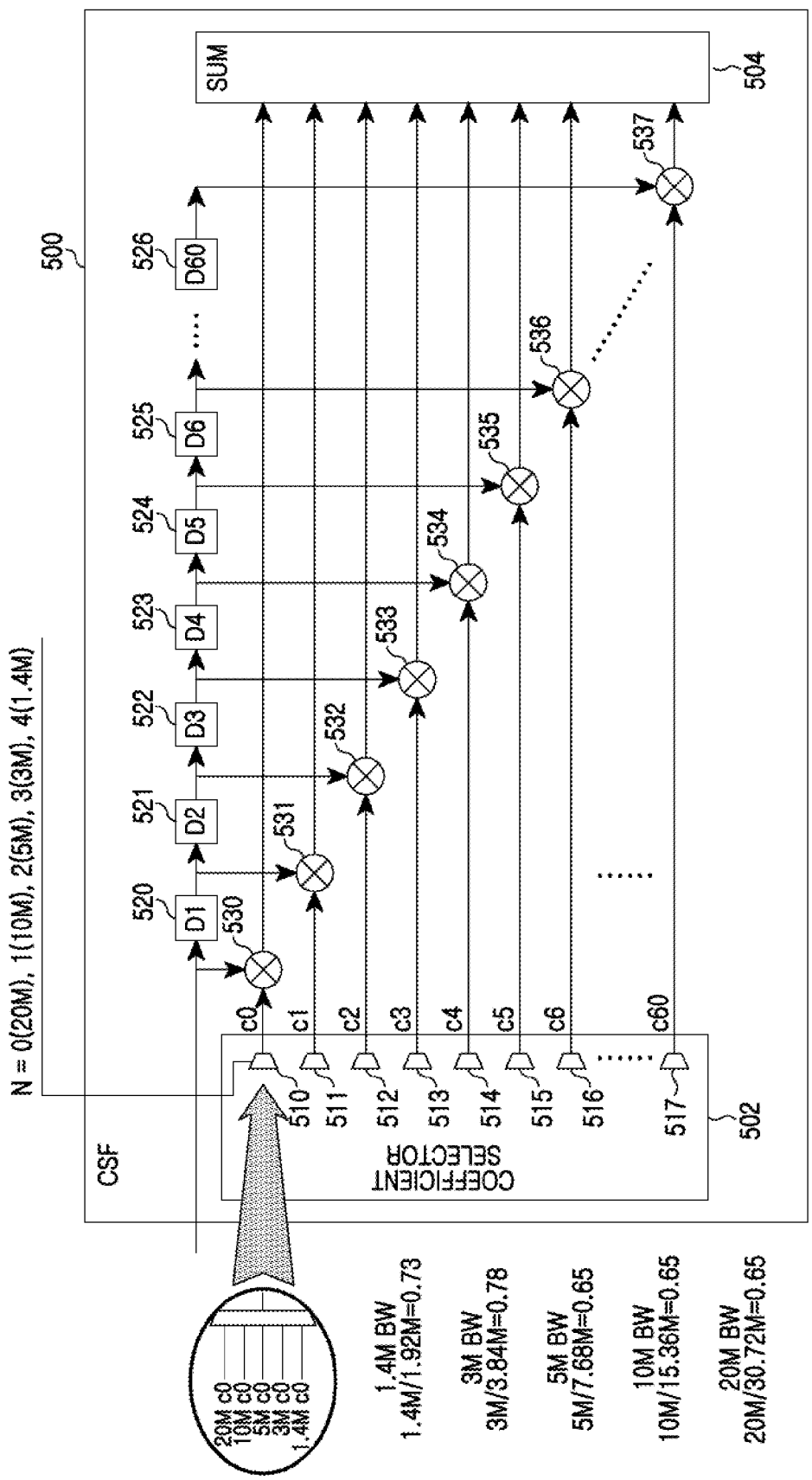
FIG. 5 is a diagram illustrating a detailed construction of a Channel Shaping Filter (CSF) in a mobile communication system according to an exemplary embodiment of the present invention.

FIG. 5 is a diagram illustrating a detailed construction of a Channel Shaping Filter (CSF) in a mobile communication system according to an exemplary embodiment of the present invention. The CSF 321 is a filter performing channel filtering according to standards regulated depending on a frequency bandwidth of an input signal. The CSF 500 is constructed as illustrated in FIG. 5 and applies a separate coefficient depending on the bandwidth of the input signal. This is because, as illustrated in Table 3 below, a cut-off rate that is a signal bandwidth compared to a clock rate is different depending on the bandwidth of the input signal.

TABLE 3

| Input signal bandwidth (MHz) | Clock rate (MHz) | Cut-off rate |
|---|---|---|
| 20 | 30.72 | 0.65 |
| 10 | 15.36 | 0.65 |
| 5 | 7.68 | 0.65 |
| 3 | 3.84 | 0.78 |
| 1.4 | 1.92 | 0.73 |

That is, to apply the separate coefficient, as illustrated in FIG. 5, the CSF 500 includes a coefficient selector 502 including a plurality of multiplexers 510 to 517, a plurality of delays 520 to 526, a plurality of multipliers 530 to 537, and a summation unit 504. Here, the plurality of multiplexers 510 to 517 each input five coefficients, and output any one of the five coefficients to a corresponding one of the plurality of multipliers 530 to 537 depending on an 'N' value that represents a bandwidth of an input signal. Also, the plurality of delays 520 to 526 each delay input signals. The plurality of multipliers 530 to 537 each multiply a signal provided from a corresponding one of the plurality of multiplexers 510 to 517 with a signal provided from a corresponding one of the plurality of delays 520 to 526, and output the multiplied signal to the summation unit 504. The summation unit 504 sums up input signals.

Referring back to FIG. 3, the four interpolators 322, 324, 326, and 328 are half-band pass filters each twice interpolating input signals. The FIR2 to FIR5 filters 323, 325, 327, and 329 are filters all using the same coefficient.

The filter logic 320 includes an interpolator 330 of an interpolation rate of 3 and an FIR6 filter 331. Accordingly, the filter logic 320 interpolates and filters a signal output through the SOL 340 and provides the interpolated and filtered signal to the mixer logic 350.

The SOL 340 receives the signal interpolated and filtered depending on the bandwidth of the input signal, from the filter logic 320. At this time, the SOL 340 includes, as illustrated in FIG. 4, a multiplexer 412. Thus, the SOL 340 selects one of the signals provided from the filter logic 320 and outputs the selected signal to the interpolator 330 of the filter logic 320. At this time, the SOL 340 receives an 'N' representing a frequency bandwidth of an input signal, thus selecting one of the signals provided from the filter logic 320. For example, if receiving an input of 0 indicating that a bandwidth of an input signal is equal to 20 MHz, the SOL 340 selects a '0' port and outputs a signal outputted from the CSF 321, to the interpolator 330 of the filter logic 320. Also, if receiving an input of 2 indicating that the bandwidth of the input signal is equal to 5 MHz, the SOL 340 selects a '2' port and outputs a signal outputted from the CSF 321 and interpolated in the two interpolators 322 and 324, to the interpolator 330 of the filter logic 320.

The mixer logic 350 includes an NCO 351 and a mixer 353 and converts a center frequency of a signal provided from the filter logic 320 into an intermediate frequency band. That is, the NCO 351 generates a preset numerically controlled value depending on an operating system. The mixer 353 converts a center frequency of a signal output from the filter logic 320 into an intermediate frequency band, which is available in an Analog to Digital Converter (ADC) (not shown), using the numerically controlled value.

Figure 6:
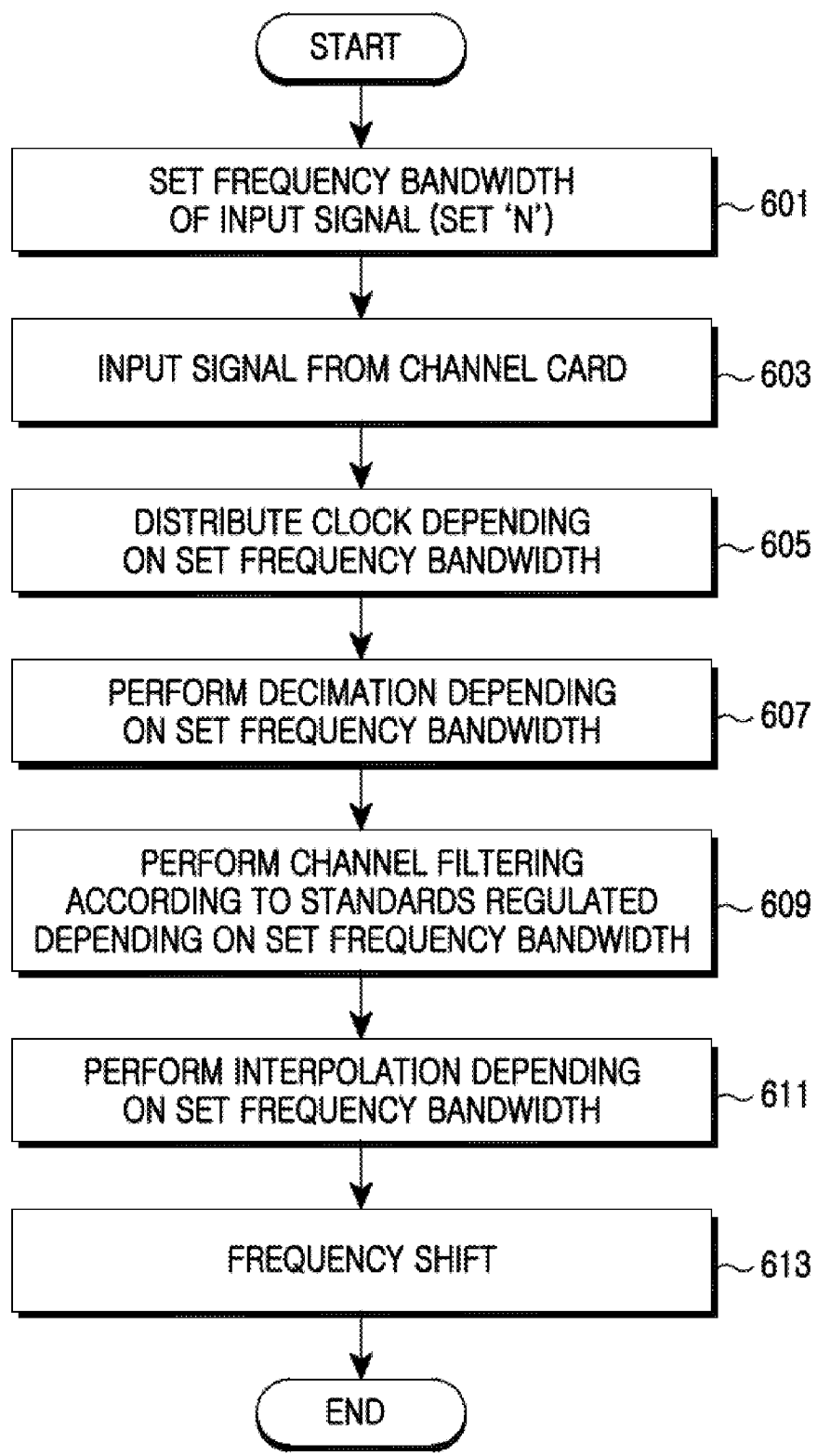
FIG. 6 is a flow diagram illustrating an operation procedure of a digital up converter in a mobile communication system according to an exemplary embodiment of the present invention.

FIG. 6 is a flow diagram illustrating an operation procedure of a digital up converter in a mobile communication system according to an exemplary embodiment of the present invention.

Referring to FIG. 6, in step 601, the digital up converter receives a frequency bandwidth of an input signal set by a user. Here, the set frequency bandwidth of the input signal can be expressed using an 'N' value. That is, if the frequency bandwidth of the input signal is equal to 20 MHz, 10 MHz, 5 MHz, 3 MHz, and 1.4 MHz, the 'N' value can be expressed by 0, 1, 2, 3, and 4, respectively.

After the frequency bandwidth of the input signal is set, if a system operates, in step 603, the digital up converter receives an input of a signal from a channel card and, in step 605, distributes a clock to each filter of the filter logic 320 depending on the set frequency bandwidth.

Then, in step 607, the digital up converter performs decimation for the input signal depending on the set frequency bandwidth. Here, the digital up converter performs the decimation using the decimator 402 for controlling a sample rate by $1/(2^N)$ depending on the set frequency bandwidth. For instance, if the set frequency bandwidth is equal to 5 MHz, the 'N' value is equal to 2 and thus, the digital up converter performs decimation and controls a sample rate by a multiple of $1/(2^2)$.

In step 609, the digital up converter performs channel filtering according to standards regulated depending on the set frequency bandwidth. Here, the digital up converter includes a plurality of multiplexers for outputting one coefficient selected among coefficients representing cut-off rates to frequency bandwidths and thus, can perform the channel filtering depending on the set frequency bandwidth.

Then, in step 611, the digital up converter performs interpolation for the channel-filtered signal depending on the set frequency bandwidth. In step 613, the digital up converter performs a frequency shift and up-converts a baseband signal into an intermediate frequency signal. Here, the digital up converter performs interpolation at an interpolation rate corresponding to the set frequency bandwidth, through a plurality of half-band pass filters twice interpolating input signals. For example, if the set frequency bandwidth is equal to 5 MHz, the 'N' value is equal to 2 and thus, an input signal passes through two interpolation half-band pass filters and a sample rate becomes four times.

Then, the digital up converter terminates the procedure.

Exemplary embodiments of the present invention describe a construction of a digital up converter as above, but are substantially identically applicable to a digital down converter as well.

Exemplary embodiments of the present invention have an effect of, by controlling a frequency of an applied clock depending on a frequency bandwidth of an input signal in a digital up converter and, through this, variably controlling a decimation rate and an interpolation rate and supporting signals of a diversity of frequency bandwidths, being capable of minimizing a hardware resource, reducing a consumption of power, and decreasing a product cost. Also, exemplary embodiments of the present invention have an effect of, by reducing the consumption of power, being capable of decreasing a size of a heat sink.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for digital up converting in a mobile communication system, the apparatus comprising:
    a Selectable Input Logic (SIL) for receiving an input of a signal from a channel card, and for performing decimation at a decimation rate variable depending on a frequency bandwidth of the input signal;
    a Scalable Clock Distribution Logic (SCDL) for controlling a clock frequency depending on the frequency bandwidth of the input signal;
    a filter logic for receiving a clock from the SCDL, for performing channel filtering for the decimated signal according to standards regulated depending on the frequency bandwidth of the input signal, and for performing interpolation at an interpolation rate variable depending on the frequency bandwidth of the input signal; and
    a mixer logic for up-converting the signal provided from the filter logic.

2. The apparatus of claim 1, wherein the filter logic comprises multi-stage interpolators and filters, and further wherein the SCDL variably controls the clock frequency provided to each of the multi-stage interpolators and filters depending on the frequency bandwidth of the input signal.

3. The apparatus of claim 2, wherein the SCDL comprises a plurality of splitters for, depending on the frequency bandwidth of the input signal, at least one of turning off and splitting the clock according to a preset rule.

4. The apparatus of claim 1, further comprising:
    a multiplexer for receiving the interpolated signal from the filter logic and for providing the signal to the mixer logic,
    wherein the multiplexer receives an output from different multi-stage interpolators and filters through each input port.

5. The apparatus of claim 1, wherein the filter logic comprises a Channel Shaping Filter (CSF) for performing channel filtering according to the standards regulated depending on the frequency bandwidth of the input signal, and further wherein the CSF comprises a plurality of multiplexers and applies a filter coefficient having a different value depending on the frequency bandwidth of the input signal.

6. The apparatus of claim 1, further comprising:
a Selectable Output Logic (SOL) for receiving the signal interpolated in the filter logic depending on the bandwidth of the input signal.

7. The apparatus of claim 6, wherein the SOL comprises a multiplexer for selecting one of signals provided from the filter logic and for outputting the selected signal to an interpolator of the filter logic.

8. The apparatus of claim 1, wherein the mixer logic comprises a Numerically Controlled Oscillator (NCO) and a mixer, and shifts a frequency of the signal output from the SOL.

9. A method for operating a digital up converter in a mobile communication system, the method comprising:
performing, by a Selectable Input Logic (SIL), decimation at a decimation rate variable depending on a frequency bandwidth of a signal input from a channel card;
controlling, by a Scalable Clock Distribution Logic (SCDL), a clock frequency depending on the frequency bandwidth of the input signal;
receiving, by a filter logic, a clock and performing channel filtering for the decimated signal according to standards regulated depending on the frequency bandwidth of the input signal;
performing, by the filter logic, interpolation for the channel-filtered signal at an interpolation rate variable depending on the frequency bandwidth of the input signal; and
up-converting, by a mixer logic, the interpolated signal.

10. The method of claim 9, wherein the performing of the interpolation comprises performing interpolation using multi-stage interpolators and filters, and further wherein the controlling of the clock frequency comprises variably controlling the clock frequency provided to each of the multi-stage interpolators and filters depending on the frequency bandwidth of the input signal.

11. The method of claim 10, wherein the controlling of the clock frequency comprises controlling the clock frequency using a plurality of splitters for, depending on the frequency bandwidth of the input signal, at least one of turning off and splitting the clock according to a preset rule.

12. The method of claim 9, further comprising:
receiving, by a multiplexer, the interpolated signal from the filter logic; and
providing the signal to the mixer logic,
wherein the multiplexer receives an output from different multi-stage interpolators and filters through each input port.

13. The method of claim 9, further comprising:
performing, by a Channel Shaping Filter (CSF), the channel filtering using a filter having a coefficient variable depending on the frequency bandwidth of the input signal,
wherein the CSF comprises a plurality of multiplexers and applies a filter coefficient having a different value depending on the frequency bandwidth of the input signal.

14. The method of claim 9, further comprising:
receiving, by a Selectable Output Logic (SOL), the signal interpolated in the filter logic depending on the bandwidth of the input signal.

15. The method of claim 14, further comprising
selecting, by a multiplexer of the SOL, one of signals provided from the filter logic; and
outputting the selected signal to an interpolator of the filter logic.

16. The method of claim 9, further comprising:
shifting, by a Numerically Controlled Oscillator (NCO) and a mixer of the mixer logic, a frequency of the signal output from the SOL.

* * * * *